(12) United States Patent
Liu et al.

(10) Patent No.: US 6,297,158 B1
(45) Date of Patent: Oct. 2, 2001

(54) STRESS MANAGEMENT OF BARRIER METAL FOR RESOLVING CU LINE CORROSION

(75) Inventors: Chung-Shi Liu, Hsin-Chu; Shau-Lin Shue, Hsinchu; Chen-Hua Yu, Hsin-Chu, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 46 days.

(21) Appl. No.: 09/583,402

(22) Filed: May 31, 2000

(51) Int. Cl.$^7$ .................................................. H01L 21/4763
(52) U.S. Cl. ...................... 438/687; 438/628; 438/629; 438/633; 438/637; 438/638; 438/643; 438/644; 438/678; 438/627
(58) Field of Search ..................................... 438/687, 637, 438/638, 625, 626, 627, 628, 629, 633, 643, 644, 645, 666, 660, 678

(56) References Cited

U.S. PATENT DOCUMENTS

| | | | |
|---|---|---|---|
| 5,968,847 | * 10/1999 | Ye et al. ................................ | 438/734 |
| 6,001,730 | 12/1999 | Farkas et al. ......................... | 438/627 |
| 6,025,259 | 2/2000 | Yu et al. ................................ | 438/618 |
| 6,025,264 | 2/2000 | Yew et al. ............................. | 438/627 |
| 6,030,896 | 2/2000 | Brown ................................... | 438/687 |
| 6,037,258 | * 3/2000 | Liu et al. .............................. | 438/687 |

* cited by examiner

Primary Examiner—John F. Niebling
Assistant Examiner—Lynne Gurley

(57) ABSTRACT

In the presently disclosed invention, a method is provided to avoid damage to a copper interconnect while subjecting the interconnect to chemical-mechanical polishing (CMP). First, a copper barrier layer is formed in a damascene structure. Then, prior to the deposition of copper metal into the damascene openings, a barrier layer is formed on the inside walls of the damascene structure. In a first embodiment, the copper barrier layer is deposited at high temperature. Then, it is cooled down in a prescribed manner. Subsequently, a copper seed layer is formed over the barrier, which is followed by the electro-chemical deposition (ECD) of copper, to form the copper damascene interconnect. Alternatively, in a second embodiment, the copper layer is formed at low temperature. Then it is annealed at a high temperature, followed by wafer cooling. Subsequently, copper seed layer is formed over the barrier layer. Next, ECD copper is formed in the damascene structure. Finally, the interconnect so formed by either of the embodiments is subjected to CMP. It is found that, through the disclosed method of treatment of the barrier layer, process stresses that are normally formed within the barrier layer are relieved, and hence no damage is incurred during the final steps of chemical-mechanical polishing.

19 Claims, 7 Drawing Sheets

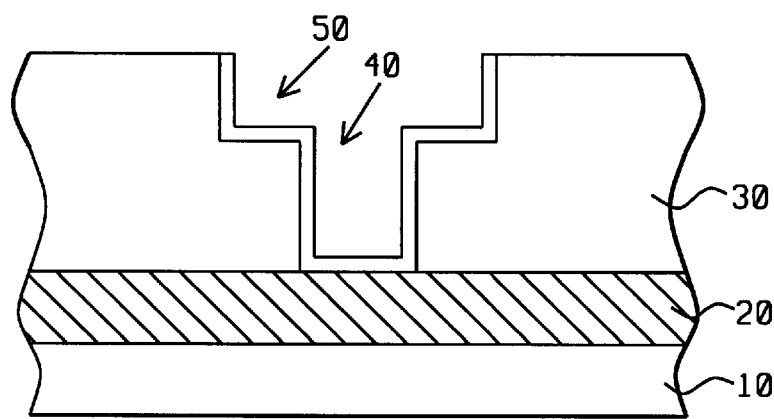
FIG. 1a – Prior Art
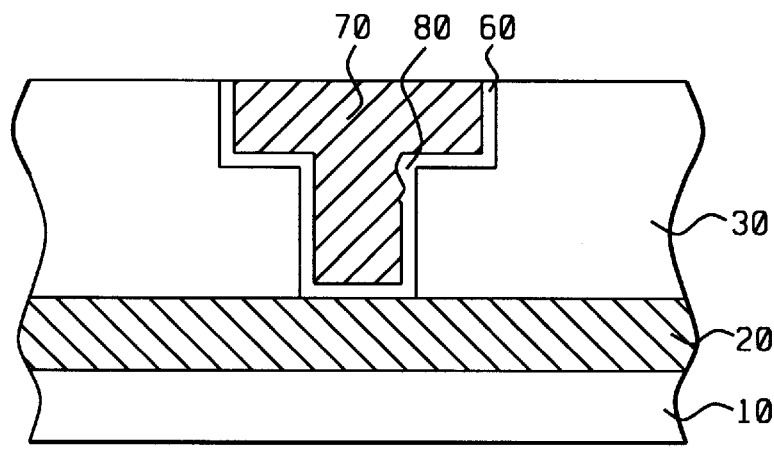
FIG. 1b – Prior Art
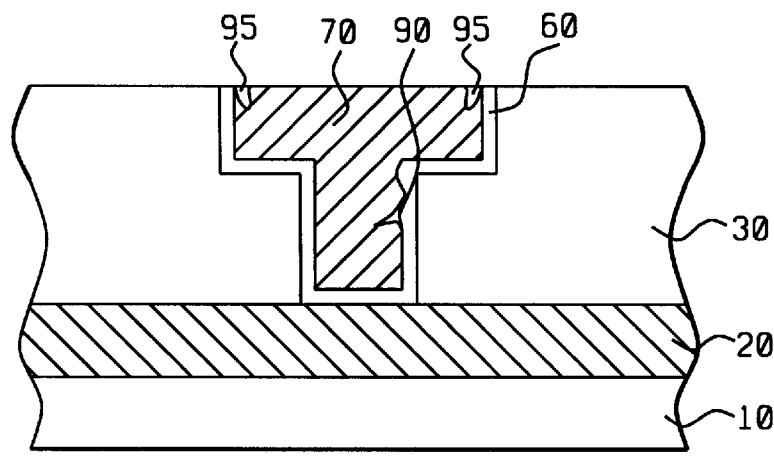
FIG. 1c – Prior Art

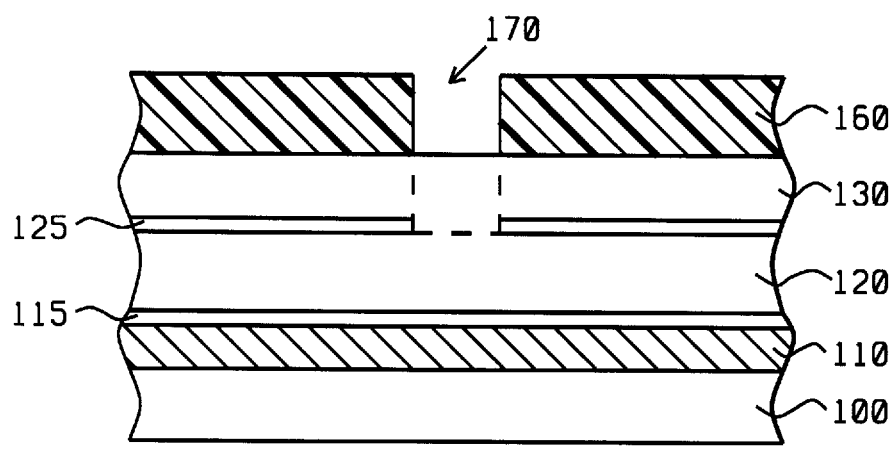
*FIG. 2a – Prior Art*
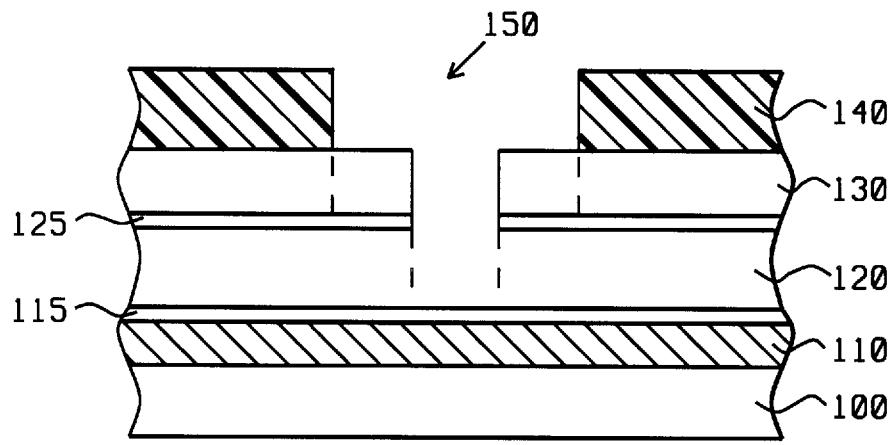
*FIG. 2b – Prior Art*
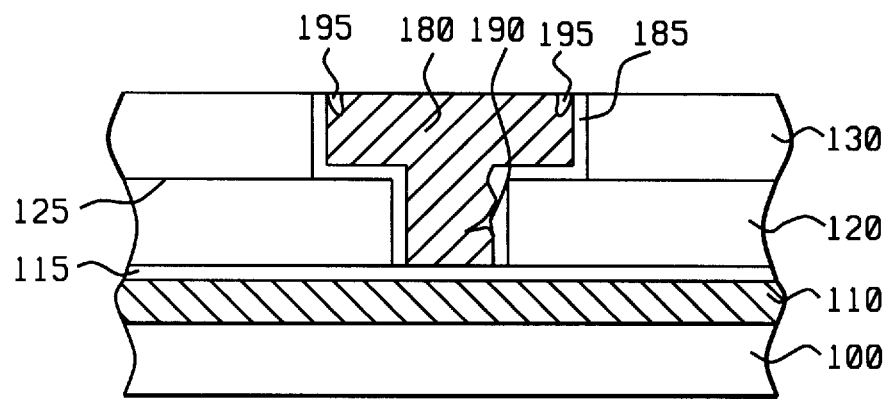
*FIG. 2c – Prior Art*

STRESS MANAGEMENT OF BARRIER METAL FOR RESOLVING CU LINE CORROSION

BACKGROUND OF THE INVENTION (1) Field of the Invention

The present invention relates to the manufacture of integrated circuits in general, and in particular, to a method of controlling corrosion of copper lines through management of stresses in barrier metals formed to bar diffusion of copper.

(2) Description of the Related Art

In general, corrosion of metal lines in semiconductor devices can be caused by many factors, including the transport of moisture and other contaminants and subsequent reaction of these with the metal lines. The moisture and contaminants may either exist in a semiconductor package material itself, or may arrive through cracks in the package. Or, there may be leaching of certain species such as phosphorus form phosphorous-doped $SiO_2$ intermetal of passivation dielectric layers, followed by reaction of the phosphorus with absorbed moisture to form phosphoric acid, which then attacks aluminum, when aluminum lines are used. Or, residual process chlorine may react with moisture to form hydrochloric acid, which then attacks metal lines. In the case of copper lines, which are more and more coming into use in semiconductor devices, the corrosion problem is exacerbated by the tendency of the copper to diffuse into surrounding materials, such as polyimides, during high temperature processing of the polyimide. Copper then combines with oxygen in the polyimide, which in turn causes severe corrosion. The corrosion may result in loss of adhesion, delamination, voids, and ultimately a catastrophic failure of the metal line. A copper diffusion barrier is therefore often required.

The use of copper (Cu) metal in interconnection metallurgy systems has long been considered as an alternative metallization material to aluminum (Al) and Al alloys due to its low resistivity and ability to reliably carry high current densities. However, its use has presented many problems, such as the possibility of diffusion into the semiconductor substrate, the low adhesive strength of Cu to various insulating layers and the difficulties inherent in masking and etching the blanket Cu layer into intricate circuit structures. In particular, diffusivity of copper and the attendant corrosion problems can cause serious reliability problems in integrated circuits. In its simplest form, using damascene process for example, —which is described in more detail below—a trench or groove of desired shape, depth and length is formed in an insulator, and then filled with copper, to form a copper line, or interconnect. Unless the inside walls of the trench are lined properly, Cu will corrode with the attendant problems of peeling, delamination, and so on. To prevent these problems, it is common first to deposit a barrier metal inside the trench prior to depositing copper. However, the process stresses that are formed within the barrier can cause cracks and voids, which in turn harbor moisture, thereby promoting unwanted corrosion. It is disclosed later in the embodiments of the present invention a method of subjecting the barrier metal to high or low temperature deposition followed by a specific step of cooling down or thermal annealing, in order to manageably relieve the stresses for the purposes of resolving metal corrosions.

Damascene process provides a method of forming conductor lines by depositing metal into preformed channels in insulating materials. The channels are formed by etching into the insulating material, and the depositing of the metal is normally accomplished by chemical vapor deposition (CVD). The damascene process has the advantage of being simple in comparison with the conventional methods of depositing a layer of metal over an insulating material, and then substractively etching the metal to form the desired metal line patterns. Damascene process is especially useful in forming not only a channel for the line, but also for forming simultaneously the underlying hole that connects to the metal layer below in a semiconductor substrate. The resulting dual-damascene interconnect is formed with one step by filling both the channel and the hole with metal.

However, filling a dual damascene structure with metal can pose problems, especially when the dimensions of the channel and the hole are small. As will be appreciated by those skilled in the art, advances in the present day ultra scale integrated (ULSI) technology demand features smaller than 0.25 micrometers ($\mu$m), and the correspondingly ultra small interconnects. One of the problems is illustrated in a prior art dual damascene shown in FIGS. 1a–1c. In FIG. 1a, substrate (10) is provided having metal layer (20) formed thereon. Insulating layer (30) is formed over the metal layer. A dual damascene structure having a channel or line trench (50) and a via or a contact hole (40) is etched into insulating layer (30), in a manner to be described more in detail later. Metal is next deposited into the damascene structure. However, in the case of copper as the metal, the inside walls of the composite dual damascene structure comprising the trench and the hole opening are first lined with barrier layer (60). It is the experience of the present manufacturing line that without proper management of process stresses, the barrier metal cracks and breaks-off at the edge of the damascene structure —reference numeral (95) in FIG. 1c—during the chemical-mechanical polishing (CMP) of the excess metal over the damascene interconnect. This is in addition to the stress induced internal stress cracks (80) within the barrier metal and extending into the bulk copper (70), as shown by reference numeral (90) in FIG. 1b. The damage caused through the interaction of highly stressed barrier metal and the abrasive action of the CMP pad, namely (90) in FIG. 1c, makes the so-formed damascene metal line susceptible to capturing moisture and other process contaminants, thus subjecting the copper metal to corrosion.

In one approach for a dual damascene process, two insulator layers (120) and (130) are formed on a substrate (100) with an intervening etch-stop layer (125), as shown in FIG. 2a. Substrate (100) is provided with metal layer (110) and a barrier layer (115). Using conventional photolithographic methods and photoresist (160), the upper insulator layer (130) is first etched, or patterned, with hole (170), as shown in FIG. 2a. The hole pattern is also formed into etch-stop layer (125). Then, the first photoresist mask is replaced with second mask (140) having a trench pattern, and the upper layer is etched to form trench (150) while at the same time the etching transfers the hole pattern in the etch-stop layer into lower insulation layer (120), as shown in FIG. 2b. It will be noted that the etch-stop layer stops the etching of the trench into the lower insulation layer. After the completion of the thusly formed dual damascene structure, both the hole opening and trench opening are filled with metal (180), and any excess material on the surface of the substrate is removed by chemical mechanical polishing, as seen in FIG. 2c.

Or, the order in which the trench and the hole are formed can be reversed (not shown). That is, using a first photoresist mask, a desired trench or trench pattern is first etched into the upper insulator material (130). The etching stops on etch-stop layer (125). Next, a second photoresist layer is formed over the substrate, thus filling the trench opening (150), and patterned with hole opening (170) The hole pattern is then etched into the lower insulator layer (120) and photoresist removed, thus forming the dual damascene structure shown in FIG. 2c. The process is repeated as many times as required to form the multi-level interconnections between metal lines and the holes formed therebetween. Contact holes are formed directly over the substrate where the metal in the hole contacts the surface of the substrate, while the via holes are formed between metal layers. However, as it will be obvious to those skilled in the art, contacts or vias with cracks, or other types of damage exposed to the manufacturing line will experience corrosion. It is important, therefore, that copper interconnect is provided with a barrier lining, and that it is stress-free to the extent that it will not be damaged during CMP. A conventional barrier lining (185), formed prior to the deposition of copper metal (180), is shown in FIG. 2c where stress induced internal cracks (190) and surface damage (195) caused by CMP interaction are also shown.

In prior art, methods have been devised to improve metal barriers. In U.S. Pat. No. 6,030,896, Brown teaches forming a self-aligned copper interconnect architecture with enhance copper diffusion barrier. A via is formed in a semiconductor device using a self-aligned copper-based pillar to connect upper and lower copper interconnect layers separated by a dielectric. The lower interconnect layer is formed on an underlying layer. The copper-based via pillar is formed on the lower interconnect layer. The upper interconnect layer is formed to make electrical contact to the exposed upper surface of the via [pillar. Conductive diffusion barrier material is formed on vertical sidewalls of the lower interconnect layer.

In another U.S. Pat. No. 6,001,730, Frakas, et al., disclose a method for forming a copper interconnect on an integrated circuit using tantalum based barrier layers. A tantalum layer is formed within an opening in a dielectric layer. A copper layer is formed over the barrier layer. a first CMP process is used to polish the copper to expose portions of the barrier. a second CMP process which different from the first CMP process is then used to polish exposed portions of the layer faster than the dielectric layer or the copper layer. After this two-step CMP process, a copper interconnect having a tantalum based barrier is formed across the integrated circuit substrate.

In U.S. Pat. No. 6,025,259, Yu, et al., teach a method of manufacturing a semiconductor device with multiple dual damascene structures that maintains the maximum density. A first dual damascene structure having a first via and a first trench is formed in a first interlayer dielectric and a first etch stop layer formed on the planarized surface of the first interlayer dielectric. Two layers of interlayer dielectric separated by a second etch stop layer formed on the surface of the first etch stop layer. A third etch stop layer is formed on the upper layer of interlayer dielectric and a first photoresist layer formed on the third etch stop layer. The photoresist layer is etched having a dimension coinciding with a width dimension of the first via. The third etch stop layer is selectively etched and the first photoresist layer removed and replaced by a second photoresist layer. The second photoresist layer is etched having dimension coinciding with a width dimension of the first trench. The two layers of interlayer dielectric and the first, second and third etch stop layers are etched to form a second dual demesne structure having a second via and a second trench having the same dimensions as the first dual damascene structure.

SUMMARY OF THE INVENTION

In the presently disclosed invention, a method is provided where the process stresses that are normally formed within the barrier metal in a damascene interconnect are relieved through a prescribed high and low temperature treatment, thereby preventing damage to the interconnect during chemical-mechanical polishing.

It is therefore an object of the present invention to provide a method of managing stresses in barrier metals to prevent copper line corrosion.

It is another object of the present invention to provide a method of forming a high-temperature barrier metal followed by a prescribed cooling step in order to relieve internally induced stresses, thereby preventing the cracking that normally occurs while chemical-mechanical polishing of a copper interconnect.

It is still another object of the present invention to provide a method of forming a standard or low-temperature barrier metal followed by high-temperature annealing and a prescribed cooling step in order to relieve internally induced stresses, thereby preventing the cracking that normally occurs while chemical-mechanical polishing of a copper interconnect.

It is yet another object of the present invention to provide a method of managing stresses in a barrier metal in order to prevent copper corrosion in a dual damascene interconnect.

These objects are accomplished by providing a semiconductor substrate having a substructure comprising devices formed in said substrate and a metal layer formed thereon; forming an insulative layer over said substrate; forming a dual damascene structure in said insulative layer; forming a high-temperature barrier layer in said dual damascene structure; performing wafer cooling; forming a seed layer over said barrier layer; forming ECD copper over said seed layer in said dual damascene structure through electro-chemical deposition (ECD); and removing excess copper layer from said substrate.

These objects are further accomplished in a second embodiment by providing a semiconductor substrate having a substructure comprising devices formed in said substrate and a metal layer formed thereon; forming an insulative layer over said substrate; forming a dual damascene structure in said insulative layer; forming a low-temperature barrier layer in said dual damascene structure; performing high-temperature annealing of said barrier layer; performing wafer cooling; forming a seed layer over said barrier layer; forming ECD copper over said seed layer in said dual damascene structure through electro-chemical deposition (ECD); and removing excess copper layer from said substrate.

BRIEF DESCRIPTION OF THE DRAWINGS

FIG. 1a is a cross-sectional view of a portion of a semiconductor substrate showing a prior art dual damascene metal interconnect.

FIG. 1b is a cross-sectional view of a portion of a semiconductor substrate showing the separation of a stressed barrier metal layer from the surrounding insulative dielectric layer in a dual damascene of prior art.

FIG. 1c is a cross-sectional view of a portion of a semiconductor substrate showing the damage caused at the upper corners of the dual damascene interconnect of FIG. 1b by the chemical-mechanical polishing of the interconnect due to the internal stresses formed in the barrier layer of the prior art.

FIGS. 2a is a cross-sectional view of a portion of a semiconductor substrate showing the forming of a hole opening in the upper insulating layer of a dual damascene structure, according to prior art.

FIGS. 2b is a cross-sectional view of a portion of a semiconductor substrate showing the forming of a line trench in the upper insulating layer of a dual damascene structure, while at the same time transferring the hole pattern to the lower insulating layer, according to prior art.

FIGS. 2c is a cross-sectional view of a portion of a semiconductor substrate showing the forming of metal in the dual damascene structure of FIG. 2b and the resultant damages caused at the upper corners of the dual damascene interconnect of FIG. 2b by the chemical-mechanical polishing of the interconnect due to the internal stresses formed in the barrier layer of the prior art, according to prior art.

DESCRIPTION OF THE PREFERRED EMBODIMENTS

Referring now the drawings, in particular to FIGS. 3a–3f, and FIGS. 4a–4f, there is shown a method of managing stresses that normally arise in a barrier metal layer that is formed as a lining on the inside walls of a damascene structure. The metal lining is formed in order to prevent metal diffusion into the surrounding insulative material of a damascene opening, as described earlier. The internal process stresses that are so formed in the barrier layer cause problems later on during the chemical-mechanical polishing of the completed metal interconnect. Furthermore, the internal stresses that are formed can induce cracks in the subsequently formed metal interconnect, and propagate into the adjacent bulk metal. These problems are exacerbated when the working metal is copper.

Figure 3A:
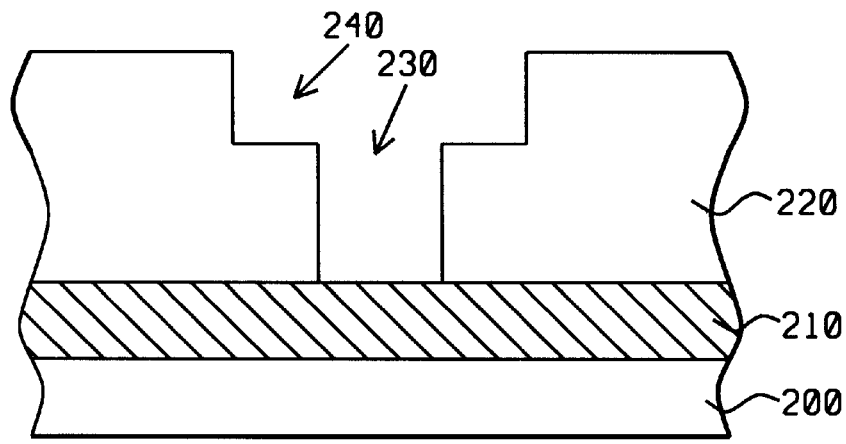
FIG. 3a is a cross-sectional view of a portion of a semiconductor substrate showing the forming of a dual damascene structure, according to the present invention.

Thus, in FIGS. 3a–3f, a method is disclosed where a high-temperature tantalum or tantalum nitride barrier metal is formed followed by a prescribed cooling step in order to relieve the internally induced stresses, thereby preventing the cracking that normally occurs while chemical-mechanical polishing of a copper interconnect. Specifically, in FIG. 3a, substrate (200), preferably silicon, is provided with a substructure of devices (not shown) and metal layer (210) formed within and thereon. FIG. 3a shows further a dual damascene structure comprising hole opening (230) and line trench (240) formed in an insulative dielectric layer (220) on the same substrate.

Forming dielectric layers are known in the art. Blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, the blanket dielectric layer (220) is preferably formed of a dielectric material chosen from the group of dielectric materials having low dielectric constant. Preferably, the dielectric layer comprises silicon oxyfluoride (SiOF), or silicon oxycarbide (SiOC), or organic polymer, and has a thickness between about 2,000 to 10,000 Å. Correspondingly, the composite dual damascene structure having trench (240) and hole opening (230) together, has a depth between about 5,000 to 15,000 Å. The trench and hole are formed by etching the dielectric layer with a recipe comprising gases $CH_4/CHF_3/O_2/Ar$.

Figure 3B:
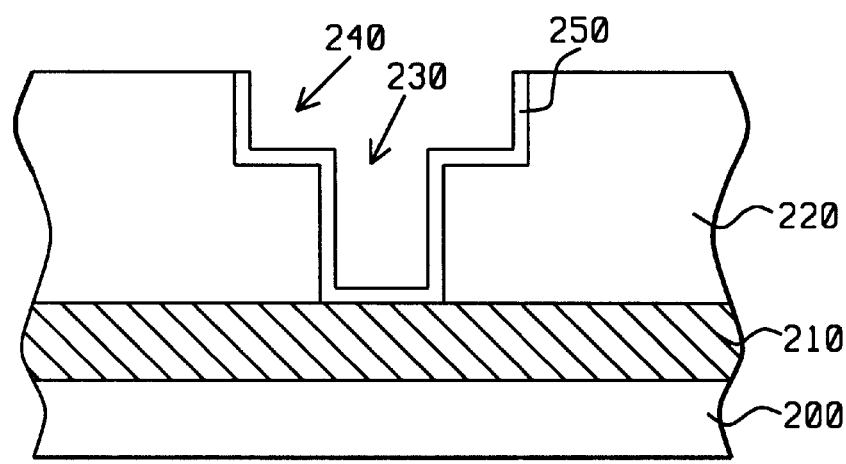
FIG. 3b is a cross-sectional view of a portion of a semiconductor substrate showing the forming of a barrier layer over the inside walls of the dual damascene structure of FIG. 3a, according to the present invention.

Next, diffusion barrier layer (250) is formed on the substrate including the inside walls of the dual damascene structure by using PVD or CVD methods as shown in FIG. 3b. It is important that this protective material be selected from a group of materials compatible with copper, that is, materials that will form a barrier to diffusion of copper into the dielectric layers surrounding the damascene structure. The barrier material is selected from a group consisting of titanium nitride, tungsten nitride, tungsten silicon nitride, titanium silicon nitride, tantalum silicon nitride, or tantalum and the deposition is performed at a relatively high temperature. It is a main feature and key aspect of the present invention that the preferred barrier layer is tantalum or tantalum nitride, and that layer (250) is deposited at a high temperature between about 300 to 400° C. to a thickness between about 50 to 500 Å. It is also critical that after the deposition of the barrier layer, the wafer is cooled down in a prescribed manner in order to relieve the stresses that are normally generated within the barrier layer and at the interface between the barrier layer and the surrounding materials. It is preferred that the wafer is cooled down at a rate between about 50 to 200° C./minute to a temperature between about 20 to 100° C.

Figure 3C:
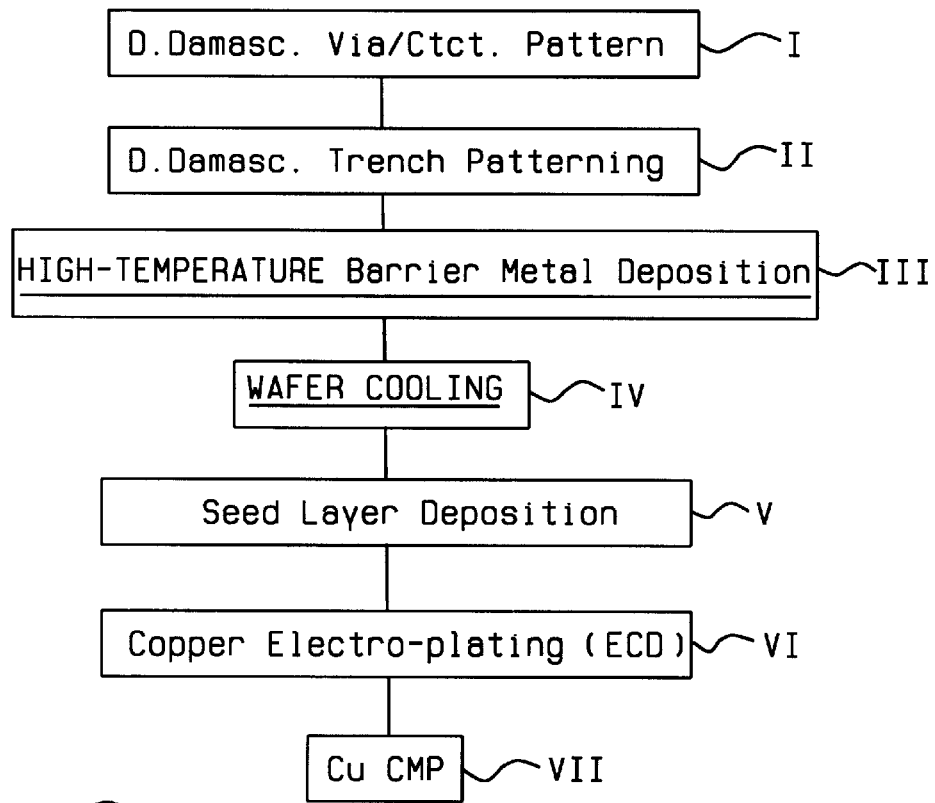
FIG. 3c is process flow diagram showing the various steps of forming an ECD copper dual damascene interconnect of the present invention with the key step of forming a high-temperature barrier metal layer followed by wafer cooling prior to the forming of a seed layer, according to the present invention.

The various steps of the first embodiment of the present invention, including the key steps, are summarized in FIG. 3c. Process steps (I) and (II) relate to the forming of the hole opening (via or contact) and the trench, respectively. Process steps (III) and (IV) are the main feature and key aspects of the present invention where the barrier metal layer is first formed at a high temperature and then cooled down, respectively. At step (V), a seed layer is formed followed by step (VI) where copper is electro-plated into the damascene structure using electro-chemical deposition (ECD) methods, which are known in the art. Finally, in step (VII), any excess metal is removed by employing chemical-mechanical polishing technique.

Figure 3D:
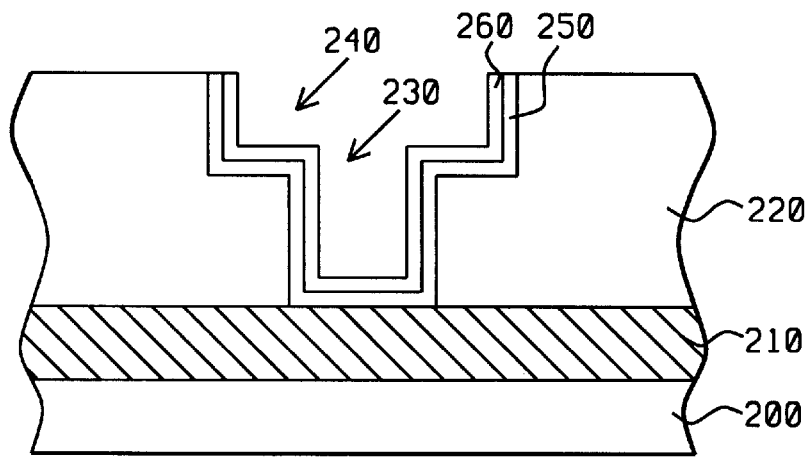
FIG. 3d is a cross-sectional view of a portion of a semiconductor substrate showing the forming of a seed layer over the barrier layer of FIG. 3b, according to the present invention.

It is important that the barrier lined damascene structure of FIG. 3b is next lined with seed layer (260) shown in FIG. 3d prior to the deposition of metal to form the dual damascene interconnect. Seed layer provides nucleation sites for the metal that is to be electro-chemically deposited (ECD) next into the damascene structure, and smoothens out the stress profile from the barrier layer to the bulk metal to be formed. It is preferred that the seed material is copper and has a layer thickness between about 1000 to 2000 Å.

Figure 3E:
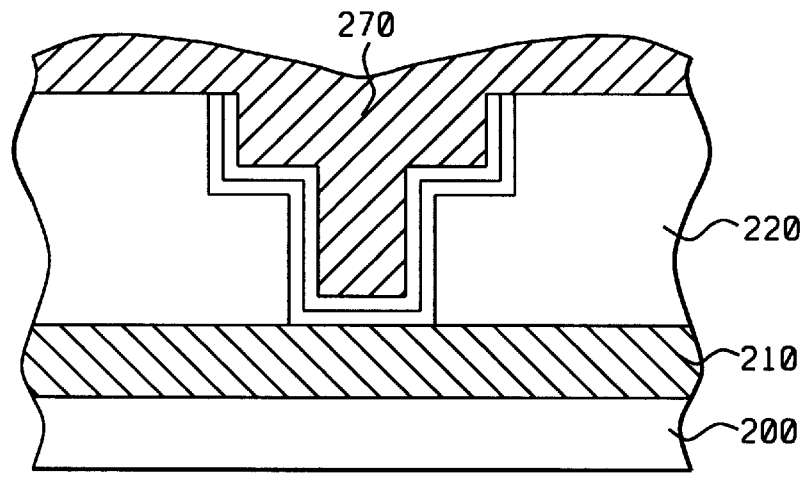
FIG. 3e is a cross-sectional view of a portion of a semiconductor substrate showing the electro-chemical deposition (ECD) of copper into the dual damascene structure of FIG. 3d, according to the present invention.
Figure 3F:
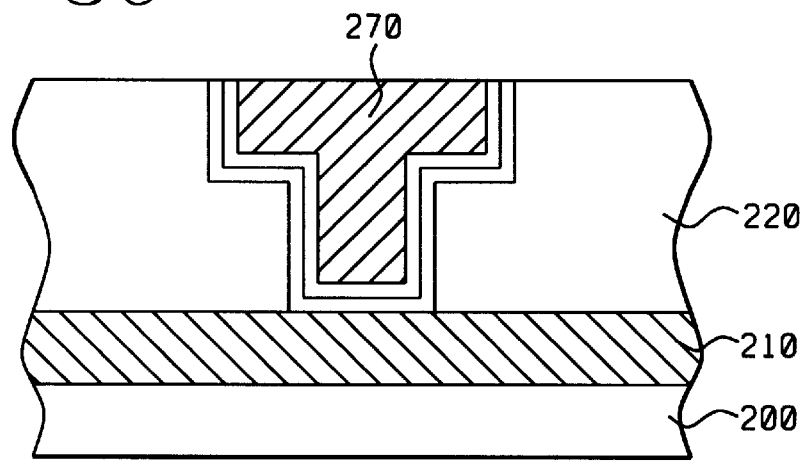
FIG. 3f is a cross-sectional view of a portion of a semiconductor substrate showing the completion of the ECD copper dual damascene interconnect of FIG. 3e without any damage being imparted to the copper interconnect by the chemical-mechanical polishing (CMP) action, according to the present invention.

As a penultimate step, copper is formed in the dual damascene structure using electro-chemical deposition (ECD) technique, which is also well-known in the art as electro-chemical plating (ECP). It is preferred that ECD copper layer (270) shown in FIG. 3e has a thickness between about 5000 to 15000 Å. Finally, excess metal shown in FIG. 3e is removed by applying the standard chemical-mechanical polishing (CMP) techniques. It will be appreciated by those skilled in the art that as a result of the high-temperature deposition of the barrier layer, followed by the disclosed cooling of the layer, and the subsequent seeding of the barrier layer, according to the teachings of the present invention, the CMP action does not cause damage to the completed copper line or interconnect, because the stress relieved barrier layer does not separate from surrounding materials.

Figure 4A:
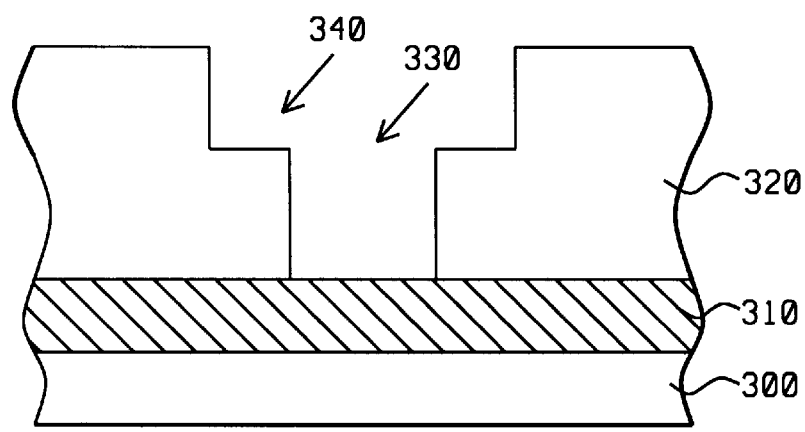
FIG. 4a is a cross-sectional view of a portion of a semiconductor substrate showing the forming of a dual damascene structure, according to the second embodiment of the present invention.

Stress management in barrier layers formed at standard and commonly used low temperatures can also be achieved by modifying the disclosed method, as shown in FIGS. 4a–4f of a second embodiment. In this embodiment, the low-temperature barrier layer is formed at standard temperatures, and then annealed at a high temperature before being cooled down. Thus, similar to FIG. 3a, in FIG. 4a, substrate (300), preferably silicon, is provided with a substructure of devices (not shown) and metal layer (310) formed within and thereon. FIG. 4a shows further a dual damascene structure comprising hole opening (330) and line trench (340) formed in an insulative dielectric layer (320) on the same substrate. Preferably, the dielectric layer comprises siliconoxyfluoride (SiOF), or siliconoxycarbide (SiOC), or organic polymer, and has a thickness between about 2000 to 10000 Å. Correspondingly, the composite dual damascene structure having trench (340) and hole opening (330) together, has a depth between about 5000 to 15000 Å. The trench and hole are formed by etching the dielectric layer with a recipe comprising gases $CH_4/CHF_3/O_2/Ar$.

Figure 4B:
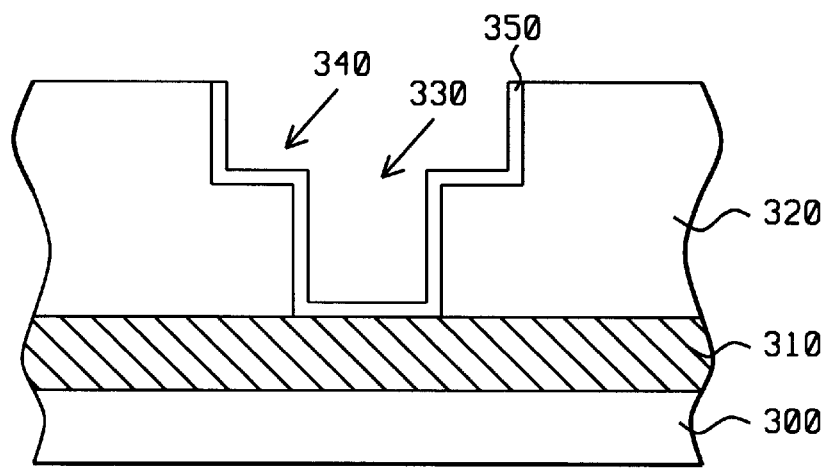
FIG. 4b is a cross-sectional view of a portion of a semiconductor substrate showing the forming of a barrier layer over the inside walls of the dual damascene structure of FIG. 4a, according to the present invention.

Next, diffusion barrier layer (350) is formed on the substrate including the inside walls of the dual damascene structure by using PVD or CVD methods as shown in FIG. 4b. The barrier layer, preferably tantalum or tantalum nitride is deposited at a standard low temperature between about 90 to 100° C. to a thickness between about 50 to 500 Å. It is a main feature and key aspect of the second embodiment that the barrier layer is then annealed to a temperature between about 300 to 400° C. Subsequently, the wafer is cooled down in a prescribed manner in order to relieve the stresses that are normally generated within the barrier layer and at the interface between the barrier layer and the surrounding materials. It is preferred that the wafer is cooled down at a rate between about 50to 200 ° C./minute to a temperature between about 20 to 100° C.

Figure 4C:
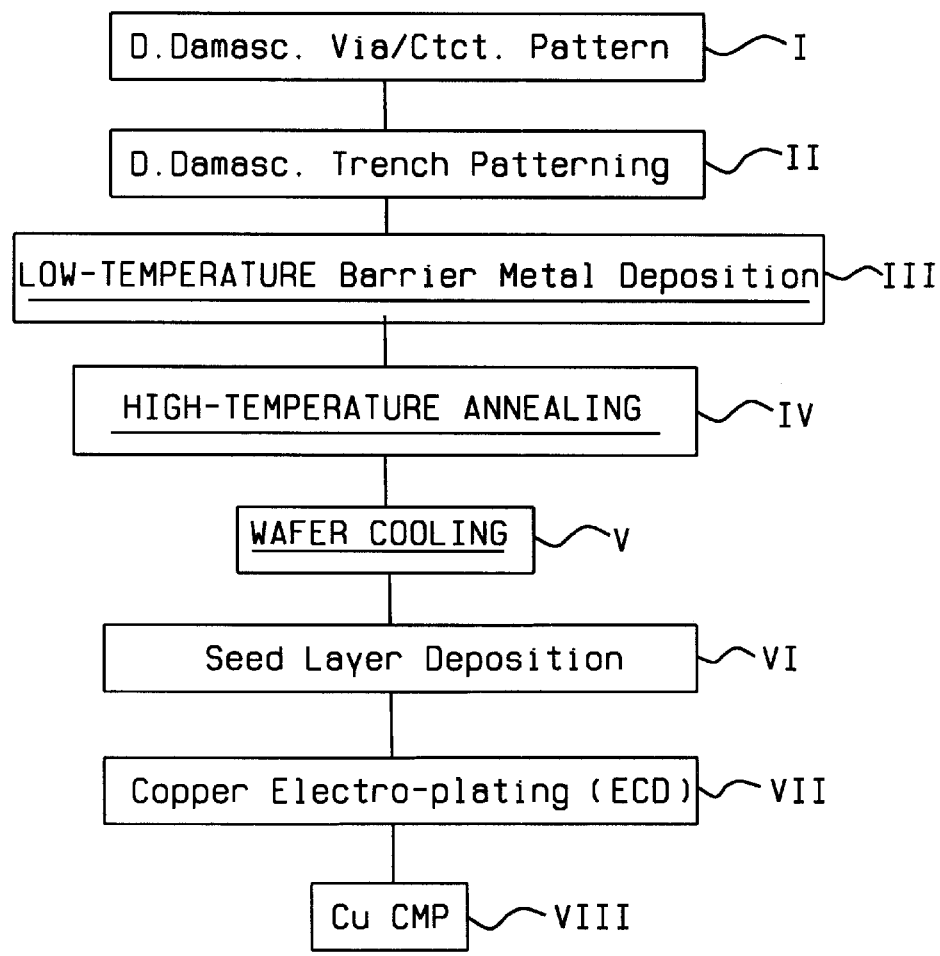
FIG. 4c is process flow diagram of the second embodiment of the present invention showing the various steps of forming an ECD copper dual damascene interconnect with the step of forming a low-temperature barrier metal layer followed by the key step of annealing the barrier metal at a high temperature followed by wafer cooling prior to the forming of a seed layer, according to the present invention.

The various steps of the second embodiment of the present invention, including the key steps, are summarized in FIG. 4c. Process steps (I) and (II) relate to the forming of the hole opening (via or contact) and the trench, respectively. Following the standard process step (III), process steps (IV) and (V) are the main feature and key aspects of the present invention where the barrier metal layer is annealed at a high temperature and then cooled down, respectively. At step (VI), a seed layer is formed followed by step (VII) where ECD copper is electro-plated into the damascene structure as shown in FIG. 4e. Any excess metal is removed in step (VIII) by employing chemical-mechanical polishing technique.

Figure 4D:
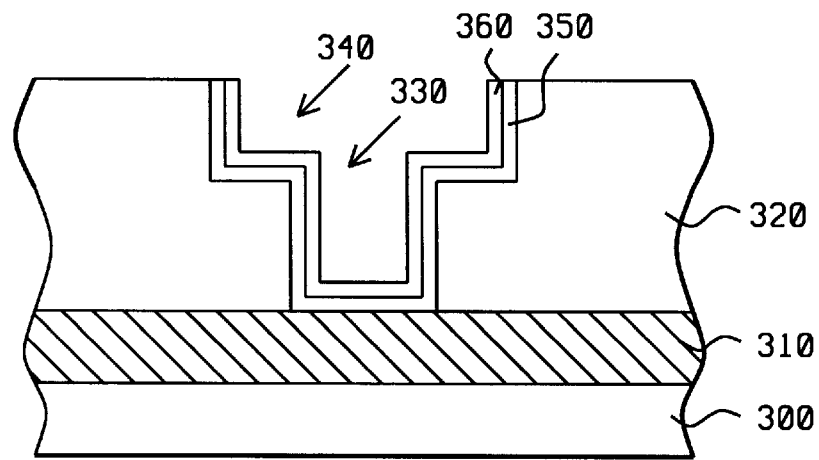
FIG. 4d is a cross-sectional view of a portion of a semiconductor substrate showing the forming of a seed layer over the barrier layer of FIG. 4b, according to the present invention.
Figure 4E:
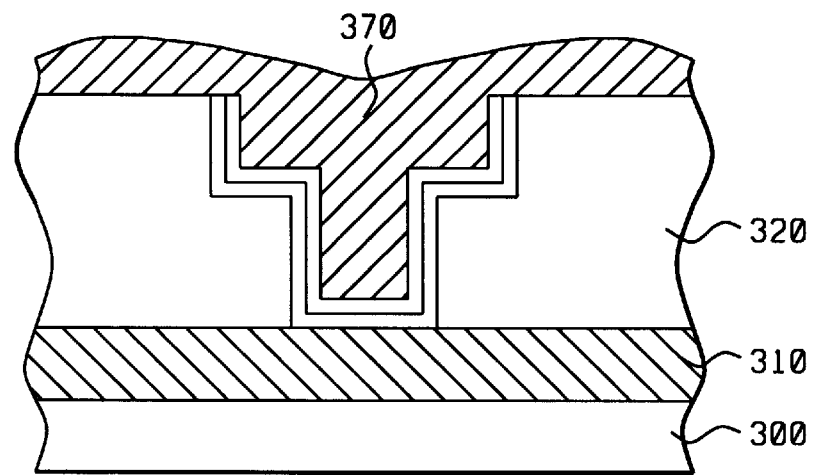
FIG. 4e is a cross-sectional view of a portion of a semiconductor substrate showing the electro-chemical deposition (ECD) of copper into the dual damascene structure of FIG. 4d, according to the present invention.
Figure 4F:
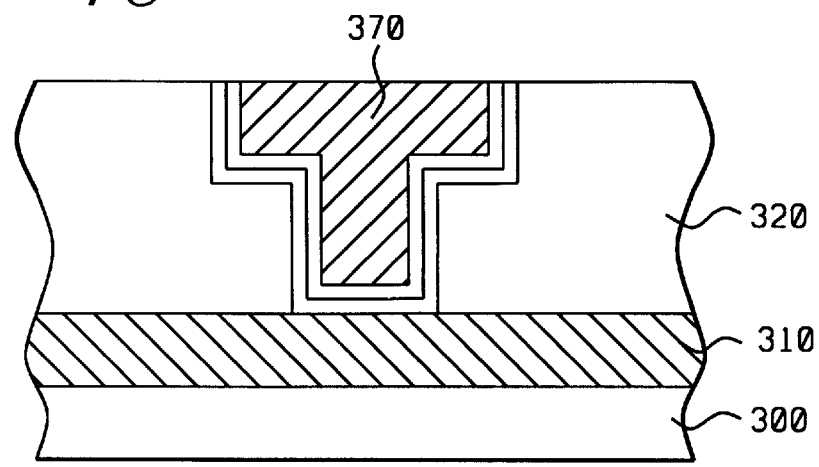
FIG. 4f is a cross-sectional view of a portion of a semiconductor substrate showing the completion of the ECD copper dual damascene interconnect of FIG. 4e without any damage being imparted to the copper interconnect by the chemical-mechanical polishing (CMP) action, according to the second embodiment of the present invention.

It is important that the barrier lined damascene structure of FIG. 4b is lined with seed layer (360) shown in FIG. 4d prior to the deposition of metal to form the dual damascene interconnect. Seed layer provides nucleation sites for the metal that is to be electro-chemically deposited (ECD) next into the damascene structure, and smoothens out the stress profile from the barrier layer to the bulk metal to be formed. It is preferred that the seed material is copper and has a layer thickness between about 1000 to 2000 Å.

As in the first embodiment, copper is next formed in the dual damascene structure using electro-chemical deposition (ECD) technique. It is preferred that ECD copper layer (370) shown in FIG. 4e has a thickness between about 5000 to 15000 Å. Finally, excess metal shown in FIG. 4e is removed by applying the standard chemical-mechanical polishing (CMP) techniques.

It will be appreciated by those skilled in the art that as a result of the high-temperature annealing of the barrier layer, followed by the disclosed cooling of the layer, and the subsequent seeding of the barrier layer, according to the teachings of the present invention, the CMP action does not cause damage to the completed copper line or interconnect, because the stress relieved barrier layer does not separate from surrounding materials.

Experiments performed on copper interconnects formed with the two disclosed methods show that the residual stresses within the instant interconnects are approximately three times less than those obtained with conventional interconnects, that is, the stresses are reduced from about $3 \times 10^{10}$ down to about $1 \times 10^{10}$ dynes/cm$^2$.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, for example, in performing the wafer cooling in situ where the high-temperature annealing is performed as disclosed in the second embodiment.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of managing stresses in barrier metal to resolve copper line corrosion comprising the steps of:

providing a semiconductor substrate having a substructure comprising devices formed in said substrate and a metal layer formed thereon;

forming an insulative layer over said substrate;

forming a dual damascene structure in said insulative layer;

forming a high-temperature barrier layer in said dual damascene structure, followed by;

performing wafer cooling, followed by;

forming a seed layer over said barrier layer;

forming ECD copper over said seed layer in said dual damascene structure through electro-chemical deposition (ECD); and removing excess copper layer from said substrate.

2. The method of claim 1, wherein said insulative layer comprises a dielectric having a thickness between about 2000 to 10000 Å.

3. The method of claim 1, wherein said dual damascene structure has a depth between about 5000 to 15000 Å.

4. The method of claim 1, wherein said forming said high-temperature barrier layer is accomplished by depositing tantalum or tantalum nitride at a temperature between about 300 to 400° C.

5. The method of claim 1, wherein said high-temperature barrier layer has a thickness between about 50 to 500.

6. The method of claim 1, wherein said performing said wafer cooling is accomplished at a rate between about 50 to 200° C./minute to a temperature between about 20 to 100° C.

7. The method of claim 1, wherein said seed layer comprises copper having a thickness between about 1000 to 2000 Å.

8. The method of claim 1, wherein said electro-chemical deposition is performed at a temperature between about 10 to 30° C.

9. The method of claim 1, wherein said ECD copper has a thickness between about 5000 to 15000 Å.

10. The method of claim 1, wherein said removing said excess copper is accomplished by chemical-mechanical polishing (CMP).

11. A method of managing stresses in barrier metal to resolve copper line corrosion comprising the steps of:

providing a semiconductor substrate having a substructure comprising devices formed in said substrate and a metal layer formed thereon;

forming an insulative layer over said substrate;

forming a dual damascene structure in said insulative layer;

forming a low-temperature barrier layer in said dual damascene structure, followed by;

performing high-temperature annealing of said barrier layer, followed by;

performing wafer cooling, followed by;

forming a seed layer over said barrier layer;

forming ECD copper over said seed layer in said dual damascene structure through electro-chemical deposition (ECD); and removing excess copper layer from said substrate.

12. The method of claim 11, wherein said insulative layer comprises a dielectric having a thickness between about 2000 to 10000 Å.

13. The method of claim 11, wherein said dual damascene structure has a depth between about 5000 to 15000 Å.

14. The method of claim 11, wherein said forming said low-temperature barrier layer is accomplished by depositing tantalum or tantalum nitride at a temperature between about 90 to 100° C.

15. The method of claim 11, wherein said performing said high-temperature annealing is accomplished at a temperature between about 250 to 300° C.

16. The method of claim 11, wherein said performing said wafer cooling is accomplished at rate between about 100° C./min. to a temperature between about 20 to 100° C.

17. The method of claim 11, wherein said seed layer comprises copper having a thickness between about 1000 to 2000 Å.

18. The method of claim 11, wherein said electro-chemical deposition is performed at a temperature between about 10 to 30° C. to form said ECD copper to a thickness between about 5000 to 15000 Å.

19. The method of claim 11, wherein said removing said excess copper is accomplished by chemical-mechanical polishing (CMP).

* * * * *

UNITED STATES PATENT AND TRADEMARK OFFICE
CERTIFICATE OF CORRECTION

PATENT NO. : 6,297,158 B1  Page 1 of 1
DATED : October 2, 2001
INVENTOR(S) : Chung-Shi Liu, Shau-Lin Shue and Chen-Hua Yu It is certified that error appears in the above-identified patent and that said Letters Patent is hereby corrected as shown below:

<u>Title page,</u>
Add item [74], -- *Attorney, Agent or Firm* -- George O. Saile; Stephen B. Ackerman; Sevgin Oktay --.

Signed and Sealed this

Fourth Day of June, 2002

*Attest:*

*Attesting Officer*

JAMES E. ROGAN
*Director of the United States Patent and Trademark Office*